United States Patent

Phoenix

[19]

[11] Patent Number: 5,945,865
[45] Date of Patent: Aug. 31, 1999

[54] FULL-SWING HIGH VOLTAGE DATA LATCH

[75] Inventor: Timothy J. Phoenix, Gilbert, Ariz.

[73] Assignee: Microchip Technology Incorporated, Chandler, Ariz.

[21] Appl. No.: 08/950,803

[22] Filed: Aug. 19, 1997

Related U.S. Application Data

[63] Continuation-in-part of application No. 08/778,157, Jan. 10, 1997, Pat. No. 5,844,441.

[51] Int. Cl.$^6$ ..................................................... H03K 3/356
[52] U.S. Cl. ........................... 327/333; 327/208; 327/210
[58] Field of Search ..................................... 327/199, 200, 327/203–210, 214, 215, 218, 333; 326/62

[56] References Cited

U.S. PATENT DOCUMENTS 4,532,436  7/1985  Bismark ................................... 327/208

FOREIGN PATENT DOCUMENTS 58-162130  9/1983  Japan ....................................... 327/208
2-37822    2/1990  Japan ....................................... 327/333

Primary Examiner—Tuan T. Lam
Attorney, Agent, or Firm—Harry M. Weiss; Jeffrey Weiss; Paul W. Davis

[57] ABSTRACT

A full-swing high voltage data latch for operation at relatively high power supply voltages. The full-swing high voltage data latch has a high voltage rail for supplying an upper voltage level and a low voltage rail for supplying a lower voltage level. A latch circuit is coupled to the upper voltage rail and to the lower voltage rail. The latch circuit is used for generating an output signal. The output signal switches with respect to an input signal when the high voltage rail and the low voltage rail operate in a low voltage mode and is latched in a state that the output signal is currently at when the high voltage rail and the low voltage rail changes state from said low voltage mode to a high voltage mode. An input circuit is coupled to the latch circuit for sending an input signal and a complementary input signal to the latch circuit. An output driver circuit is coupled to the latch circuit for receiving the output signal from the latch circuit and for providing a full-swing output data latch signal. The full-swing high voltage data latch ranges from the upper voltage level of the high voltage rail to ground.

30 Claims, 1 Drawing Sheet

1

FULL-SWING HIGH VOLTAGE DATA LATCH

RELATED APPLICATION

This patent application is a Continuation-In-Part of patent application entitled "HIGH VOLTAGE LATCH USING CMOS TRANSISTORS AND METHOD THEREFOR," Ser. No. 08/778,157, now U.S. Pat. No. 5,844,441 filed Jan. 10, 1997, in the name of the same inventor, and assigned to the same assignee as the present patent application, and is incorporated herein by reference.

BACKGROUND OF THE INVENTION

1. Field of the Invention

This invention relates generally to latches and, more specifically, to a data latch that provides a full swing $V_{pp}$ to ground output signal. The full-swing high voltage data latch is designed using CMOS technology wherein no PMOS transistor will have a voltage level greater than $V_{pp}/2$ volts across any node. This will allow PMOS transistors with lower voltage breakdown levels to be used.

2. Description of the Prior Art

Currently, in integrated circuit systems, CMOS devices are the most commonly used technology. The voltage levels used to power the CMOS devices are dependent upon the particular geometry of the CMOS devices as well as variations in the fabrication process of the CMOS devices. Most CMOS devices can operate at voltage supply levels of five (5) volts or less. With a voltage supply level of five (5) volts, a CMOS device will typically generate an output signal between the range of ground and five (5) volts.

A problem arises since many systems using CMOS technology must drive or control devices requiring input signals having a voltage magnitude greater than five (5) volts. For example, LCD displays require input signals greater than five (5) volts in order to properly function. Furthermore, memory devices like Electrical Erasable Programmable Read Only Memory (EEPROM) devices require input signals as high as twenty (20) volts or more in order to program the EEPROM device. However, CMOS devices are limited to the amount of voltage they can handle. The high voltages across the CMOS devices when used to drive LCD displays or to program EEPROM devices can cause channel, dielectric, and/or junction breakdown within the CMOS devices.

Therefore, a need existed to provide an improve high voltage data latch. The improved high voltage data latch must provide a full swing $V_{pp}$ to ground output signal. The full-swing high voltage data latch must use CMOS devices and be able to generate an output signal having a voltage level significantly greater than five (5) volts without suffering channel, dielectric, and/or junction breakdown within the CMOS devices. The full-swing high voltage data latch must be designed using CMOS technology wherein no PMOS transistor will have a voltage level greater than $V_{pp}/2$ volts across any node. This will allow PMOS transistors with lower voltage breakdown levels to be used.

SUMMARY OF THE INVENTION

In accordance with one embodiment of the present invention, it is an object of this invention to provide an improved high voltage data latch.

It is still another object of the present invention to provide an improved high voltage data latch that provides a full swing $V_{pp}$ to ground output signal.

It is another object of the present invention to provide a full-swing high voltage data latch that uses CMOS devices.

It is another object of the present invention to provide a full-swing high voltage data latch that uses CMOS devices that is able to generate an output signal having a voltage level significantly greater than five (5) volts without suffering channel, dielectric, and/or junction breakdown within the CMOS devices.

It is still another object of the present invention to provide a full-swing high voltage data latch that is designed using CMOS technology wherein no PMOS transistor will have a voltage level greater than $V_{pp}/2$ volts across any node thus allowing PMOS transistors with lower voltage breakdown levels to be used.

BRIEF DESCRIPTION OF THE PREFERRED EMBODIMENTS

In accordance with one embodiment of the present invention, a full-swing high voltage data latch for operation at relatively high power supply voltages is disclosed. The full-swing high voltage data latch uses a high voltage rail for supplying an upper voltage level and a low voltage rail for supplying a lower voltage level. A latch circuit is coupled to both the upper voltage rail and to the lower voltage rail. The latch circuit is used for generating an output signal. The output signal will switch with respect to an input signal when the high voltage rail and the low voltage rail operate in a low voltage mode. The output signal will be latched in a state that the output signal is currently at when the high voltage rail and the low voltage rail changes state from a low voltage mode to a high voltage mode. An input circuit is coupled to the latch circuit for sending an input signal and a complementary input signal to the latch circuit. An output driver circuit is also coupled to the latch circuit. The output driver is used for receiving the output signal from the latch circuit and for providing a full-swing output data latch signal. The full-swing output data latch signal will have a range from the upper voltage level of the high voltage rail to ground.

The foregoing and other objects, features, and advantages of the invention will be apparent from the following, more particular, description of the preferred embodiments of the invention, as illustrated in the accompanying drawings.

DETAILED DESCRIPTION OF THE PREFERRED EMBODIMENTS

Figure 1:
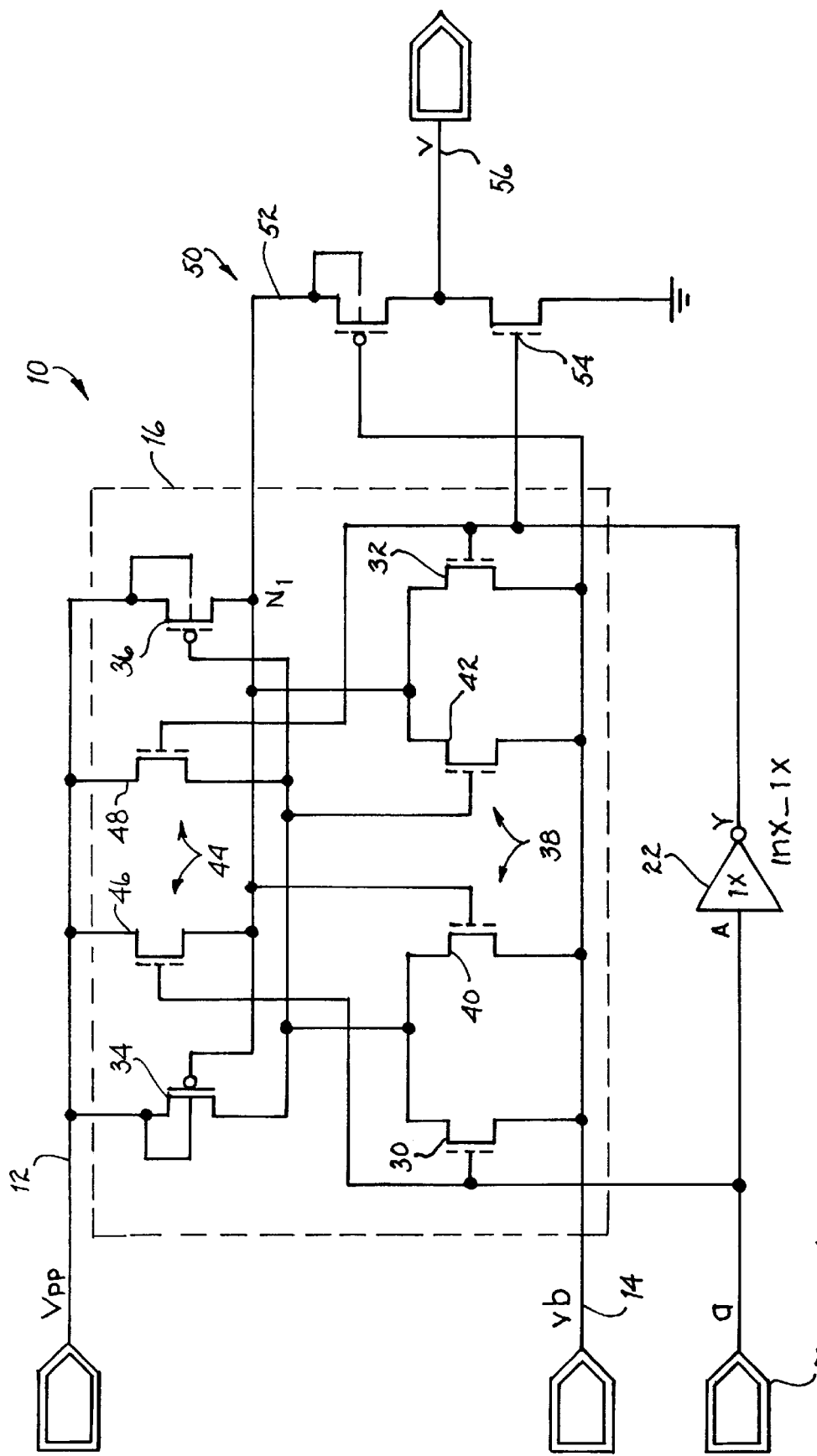
FIG. 1 is a simplified electrical schematic depicting the full-swing high voltage data latch of the present invention.

Referring to FIG. 1, a full swing high voltage data latch 10 (hereinafter latch 10) using CMOS technology is shown. The latch 10 has a high voltage rail 12 and a low voltage rail 14 for supplying power to the latch 10. The high voltage rail 12 supplies a voltage $V_{pp}$. In the preferred embodiment of the present invention, voltage $V_{pp}$ will range anywhere from two (2) volts to twenty-two (22) volts or more. The low voltage rail supplies a voltage $V_b$. The system 10 has two modes of operation. In a low voltage mode, $V_b$ will be set to ground potential. In a high voltage mode, $V_b$ will be set to a voltage greater than ground potential but less than the voltage $V_{pp}$. In the preferred embodiment of the present invention, in the high voltage mode, $V_b$ is set to a voltage approximately equal to $V_{pp}/2$.

A latching CMOS circuit 16 is coupled to the high voltage rail 12 and to the low voltage rail 14. The latching CMOS circuit 16 will generate an output signal at node N1 based on the inputs to the latching CMOS circuit 16. The value at node N1 will either be the voltage of the high voltage rail 12, $V_{pp}$, or the voltage of the low voltage rail 14, $V_b$.

As stated above, the latch 10 has two modes of operation. In the low voltage mode, the output signal at node N1 switches with respect to the input signal. In a high voltage mode, the output signal is latched in a state that the output signal was currently under when the high voltage rail 12 and the low voltage rail 14 changes state from the low voltage mode to the high voltage mode.

An input circuit 18 is coupled to the latching CMOS circuit 16. The input circuit 18 is used for sending an input signal and a complementary input signal to the latching CMOS circuit 16. The input circuit 18 uses an input terminal 20 for receiving the input signal and for sending the input signal to the latching CMOS circuit 16. The input terminal 20 is coupled to an input of an inverter 22. The output of the inverter 22 is coupled to the latching CMOS circuit 16. The inverter 22 is used for generating a complementary input signal and for sending the complementary input signal to the latching CMOS circuit 16.

The latching CMOS circuit 16 is comprised of a plurality of CMOS transistors. A pair of n-channel CMOS transistors 30 and 32 are coupled to the input circuit 18. Both n-channel transistors 30 and 32 have gate, source, and drain terminals. The n-channel transistors 30 and 32 are connected to the latch 10 in the following manner. The gate of the n-channel transistor 30 is coupled to the input terminal 20 for receiving the input signal. The source of n-channel transistor 30 is coupled to the low voltage rail 14. The gate of the n-channel transistor 32 is coupled to the output of the inverter 22 for receiving the complementary input signal, while the source of n-channel transistor 30 is coupled to the low voltage rail 14.

A first p-channel CMOS transistors 34 is coupled to the n-channel transistors 30 and 32. The p-channel transistor 34 has gate, source, drain, and bulk terminals. The gate terminal of the p-channel transistor 34 is directly coupled to the drain terminal of transistor 32. The drain terminal of the p-channel transistor 34 is coupled to the drain terminal of the n-channel transistor 30. The source terminal and the bulk terminal of the p-channel transistor 34 are coupled to the high voltage rail 12. A second P-channel CMOS transistor 36 is connected in a similar fashion. The gate terminal of p-channel transistor 36 is coupled to the drain terminal of the n-channel transistor 30. The drain terminal of the p-channel transistor 36 is coupled to the drain terminal of the n-channel transistor 32. The source terminal and the bulk terminal of the p-channel transistor 36 are coupled to the high voltage rail 12.

A holding circuit 38 is coupled to the gate terminals of the p-channel transistors 34 and 36. The holding circuit 38 is used for holding the output signal at node N1 of the latching CMOS circuit 16 in a present state until conditions change which will force the latching CMOS circuit 16 to change the output signal (i.e., changes in the input signal and/or change in the mode of operation of the latching CMOS circuit 16). The holding circuit 38 is comprised of a pair of n-channel CMOS transistors 40 and 42. The n-channel transistor 40 has gate, drain and source terminals. The gate terminal of the n-channel transistor 40 is coupled to the gate terminal of the p-channel transistor 34. The drain terminal of the n-channel transistor 40 is coupled to the drain terminal of the p-channel transistor 34 and to the gate terminal of the p-channel transistor 36. The source terminal of the n-channel transistor 40 is coupled to the low voltage rail 14. Likewise, the n-channel transistor 42 has gate, drain and source terminals. The gate terminal of the n-channel transistor 42 is coupled to the gate terminal of the p-channel transistor 36. The drain terminal of the n-channel transistor 42 is coupled to the gate terminal of the p-channel transistor 34 and to the drain terminal of the p-channel transistor 36. The source terminal of the transistor 42 is coupled to the low voltage rail 14.

The latching CMOS circuit 16 further includes a switching circuit 44. The switching circuit 44 is coupled to the input circuit 18. The switching circuit 44 allows the output signal at node N1 of the latching CMOS circuit 16 to switch faster with respect to the input signal when the latching CMOS circuit 16 is operating under a low voltage mode. The switching circuit 44 is comprised of two n-channel CMOS transistors 46 and 48. The n-channel transistor 46 has gate, drain, and source terminals and is coupled to the latch 10 in the following manner. The gate terminal of the n-channel transistor 46 is coupled to the input terminal 20 and to the gate terminal of the n-channel transistor 30. The drain terminal of the n-channel transistor 46 is coupled to the high voltage rail 12. The source terminal of n-channel transistor 46 is coupled to the gate terminal of the p-channel transistor 34 and to the gate terminal of the n-channel transistor 40. Likewise, the n-channel transistor 48 has gate, drain and source terminals. The n-channel transistor 48 is coupled to the latch 10 in the following manner. The gate terminal of the n-channel transistor 48 is coupled to the output of the inverter 22 and to the gate terminal of the n-channel transistor 32. The drain terminal of the n-channel transistor is coupled to the high voltage rail 12. The source terminal of the n-channel transistor 48 is coupled to the gate terminal of the p-channel transistor 36 and to the gate terminal of the n-channel transistor 42.

An output driver circuit 50 is also coupled to the latching CMOS circuit 16. The output driver circuit 50 is used for providing a full swing $V_{pp}$ to ground output data latch signal. In the preferred embodiment of the present invention, the output driver circuit 50 is comprised of a p-channel transistor 52 and an n-channel transistor 54. The p-channel transistor 52 has gate, source, drain, and bulk terminals. The gate terminal of the p-channel transistor 52 is directly coupled to the low voltage rail 14. The source terminal of the p-channel transistor 52 is coupled to the bulk terminal of the p-channel transistor 52 and to the drain terminal of the p-channel transistor 36. The drain terminal of the p-channel transistor 52 is coupled to an output terminal 56. The n-channel transistor 54 has drain, gate, and source terminals. The drain terminal of the n-channel transistor 54 is coupled to the output terminal. The gate terminal of the n-channel transistor 54 is coupled to the output of the inverter 22, while the source terminal of the n-channel transistor 54 is grounded.

OPERATION

The system 10 operates in the following manner. The latching CMOS circuit 16 has two modes of operation. In a low voltage mode ($V_{pp}=V_{DD}$ and $V_b$=Ground) the output switches with respect to the inputs. Thus, if a high input signal is sent to the input terminal 20, the n-channel transistor 30 will conduct as will the n-channel transistor 46. With the n-channel transistor 46 turned on, the voltage at the source terminal of the n-channel transistor 46 will be sufficient to turn on the n-channel transistor 40. With both n-channel transistors 30 and 40 turned on, the voltage at the drain terminals of both n-channel transistors 30 and 40 will be pulled toward the voltage setting of the low voltage rail 14 (i.e., ground potential in the low voltage mode). Since the gate terminal of the p-channel transistor 36 is coupled to the drain terminals of the n-channel transistors 30 and 40, the p-channel transistor 36 will also conduct. Thus, the voltage at node N1 will be approximately equal to that of the high voltage rail 12. With the p-channel transistor 52 turned on, the voltage at the output terminal 56 will also be approximately equal to that of the high voltage rail 12, $V_{pp}$.

If the input signal at the input terminal 20 goes low, the inverter 22 will generate and send out a high input signal which will turn on the n-channel transistors 32 and 48. With the n-channel transistor 48 turned on, the voltage at the source terminal of the n-channel transistor 48 will be sufficient to turn on the transistor 42. With both n-channel transistors 32 and 42 turned on, the voltage at the drain terminals of both n-channel transistors 32 and 42 will be pulled toward the voltage setting of the low voltage rail 14 (i.e., ground potential in the low voltage mode). Thus, the voltage at node N1 will have a magnitude approximately equal to that of the low voltage rail 14. Since the voltage at the source and gate terminal of the p-channel transistor 52 will both be at the voltage setting of the low voltage rail 14, the p-channel transistor 52 will not be active. The high input signal of the inverter 22 will activate the n-channel transistor 54. With the p-channel transistor 52 deactive and the n-channel transistor 54 active, the output terminal 56 will be pulled towards ground potential.

As can be seen from the above description, in the low voltage mode ($V_{pp}=V_{DD}$ and $V_b$=Ground) the voltage at node N1 switches with respect to the input signal. Furthermore, as can be seen from FIG. 1, the latch 10 is designed using CMOS technology wherein the p-channel transistors 34, 36, and 52 are trapped between $V_{pp}$ and $V_b$. Thus, in the preferred embodiment of the present invention, none of the p-channel transistors 34, 36, and 52 will have a voltage level greater than $V_{pp}/2$ volts across any node. This allows PMOS transistors with lower voltage breakdown levels to be used in the construction of the system 10.

In a high voltage mode ($V_{pp}>V_b>V_{dd}$) the output at node N1 will be latched in the state it was in when the voltage rails changed states from the low voltage mode to the high voltage mode. Thus, if the system 10 was operating under a low voltage mode with a high input signal, the node N1 would output a voltage signal approximately equal in magnitude to the voltage level of the high voltage rail 12. If the system 10 changes to a high voltage mode such that the voltage of the low voltage rail 14 is greater than $V_{dd}$ but less than $V_{pp}$, the output at the node N1 will be latched at a voltage approximately equal to that of the high voltage rail 12. Even if the input signal were to change, the change in the input signal would not be large enough to change the state at node N1.

While the invention has been particularly shown and described with reference to preferred embodiments thereof, it will be understood by those skilled in the art that the foregoing and other changes in form, and details may be made therein without departing from the spirit and scope of the invention.

What is claimed is:

1. A full-swing high voltage data latch for operation at relatively high power supply voltages comprising, in combination:

a high voltage rail for supplying an upper voltage level;

a low voltage rail for supplying a lower voltage level;

a latch circuit coupled to said high voltage rail and to said low voltage rail for generating an output signal wherein said output signal switches with respect to an input signal when said high voltage rail and said low voltage rail operate in a low voltage mode and said output signal is latched in a state that said output signal is currently at when said high voltage rail and said low voltage rail changes state from said low voltage mode to a high voltage mode;

an input circuit coupled to said latch circuit for sending said input signal and a complementary input signal to said latch circuit; and an output driver circuit coupled to said latch circuit for receiving said output signal from said latch circuit and for providing a full-swing output data latch signal wherein said full-swing output data latch signal ranges from said upper voltage level of said high voltage rail to ground.

2. A full-swing high voltage data latch in accordance with claim 1 wherein said input circuit comprises:

an input terminal coupled to said latch circuit for receiving said input signal and for sending said input signal to said latch circuit; and an inverter having an input coupled to said input terminal and an output coupled to said latch circuit for generating said complementary input signal and for sending said complementary input signal to said latch circuit.

3. A full-swing high voltage data latch in accordance with claim 2 wherein said latch circuit comprises:

a first transistor having a gate, drain and source terminals wherein said gate terminal of said first transistor is coupled to said input terminal and said source terminal of said first transistor is coupled to said low voltage rail;

a second transistor having a gate, drain and source terminals wherein said gate terminal of said second transistor is coupled to said output of said inverter, said source terminal of said second transistor is coupled to said low voltage rail, and said drain terminal of said second transistor is coupled to said output driver circuit;

a third transistor having a gate, drain, source and bulk terminals wherein said gate terminal of said third transistor is coupled to said drain terminal of said second transistor, said source and bulk terminals of said third transistor are coupled to said high voltage rail, and said drain terminal of said third transistor is coupled to said drain terminal of said first transistor; and a fourth transistor having a gate, drain, source and bulk terminals wherein said gate terminal of said fourth transistor is coupled to said drain terminal of said first transistor, said source and bulk terminals of said fourth transistor are coupled to said high voltage rail, and said drain terminal of said fourth transistor is coupled to said drain terminal of said second transistor and to said output driver circuit.

4. A full-swing high voltage data latch in accordance with claim 3 wherein said first transistor and said second transistors are both n-channel transistors.

5. A full-swing high voltage data latch in accordance with claim 3 wherein said third transistor and said fourth transistors are both p-channel transistors.

6. A full-swing high voltage data latch in accordance with claim 3 wherein said latch circuit further comprises a holding circuit coupled to said low voltage rail and to said output driver circuit for holding said output signal of said latch circuit in a present state.

7. A full-swing high voltage data latch in accordance with claim 6 wherein said holding circuit comprises:

a fifth transistor having a gate, drain and source terminals wherein said gate terminal of said fifth transistor is coupled to said gate terminal of said third transistor, said drain terminal of said fifth transistor is coupled to said gate terminal of said fourth transistor and to said drain terminal of said third transistor, and said source terminal of said fifth transistor is coupled to said low voltage rail; and a sixth transistor having a gate, drain and source terminals wherein said gate terminal of said sixth transistor is coupled to said gate terminal of said fourth transistor, said drain terminal of said sixth transistor is coupled to said gate terminal of said third transistor and to said output driver circuit, and said source terminal of said sixth transistor is coupled to said low voltage rail.

8. A full-swing high voltage data latch in accordance with claim 7 wherein said fifth transistor and said sixth transistor are both n-channel transistors.

9. A full-swing high voltage data latch in accordance with claim 7 wherein said latch circuit further comprises a switching circuit coupled to said input circuit for allowing said output signal to switch faster with respect to said input signal and said complementary input signal when said high voltage rail and said low voltage rail operate in said low voltage mode.

10. A full-swing high voltage data latch in accordance with claim 9 wherein said switching circuit comprises:

a seventh transistor having a gate, drain and source terminals wherein said gate terminal of said seventh transistor is coupled to said input terminal, said drain terminal of said seventh transistor is coupled to said high voltage rail, and said source terminal of said seventh transistor is coupled to said gate terminal of said fifth transistor; and an eighth transistor having a gate, drain and source terminals wherein said gate terminal of said eighth transistor is coupled to said output of said inverter, said drain terminal of said eighth transistor is coupled to said high voltage rail, and said source terminal of said eighth transistor is coupled to said gate terminal of said sixth transistor.

11. A full-swing high voltage data latch in accordance with claim 10 wherein said seventh transistor and said eighth transistor are both n-channel transistors.

12. A full-swing high voltage data latch in accordance with claim 11 wherein said output driver circuit comprises:

an output terminal;

a ninth transistor having a gate, drain, source and bulk terminals wherein said gate terminal of said ninth transistor is coupled to said low voltage rail, said drain terminal of said ninth transistor is coupled to said output terminal, and said source and bulk terminals of said ninth transistor is coupled to said drain terminal of said fourth transistor; and a tenth transistor having a gate, drain and source terminals wherein said gate terminal of said tenth transistor is coupled to said output of said inverter, said drain terminal of said tenth transistor is coupled to said output terminal, and said source terminal of said tenth transistor is coupled to ground potential.

13. A full-swing high voltage data latch in accordance with claim 12 wherein said ninth transistor is a p-channel transistors.

14. A full-swing high voltage data latch in accordance with claim 12 wherein said tenth transistor is an n-channel transistors.

15. A full-swing high voltage data latch in accordance with claim 1 wherein said low voltage rail is at ground potential when said latch is operating under said low voltage mode.

16. A full-swing high voltage data latch in accordance with claim 1 wherein said low voltage rail is at a voltage greater than ground potential and less than a voltage of said high voltage rail when said latch is operating under said high voltage mode.

17. A full-swing high voltage data latch for operation at relatively high power supply voltages comprising, in combination:

a high voltage rail for supplying an upper voltage level;

a low voltage rail for supplying a lower voltage level;

a latch circuit coupled to said high voltage rail and to said low voltage rail for generating an output signal wherein said output signal switches with respect to an input signal when said high voltage rail and said low voltage rail operate in a low voltage mode and said output signal is latched in a state that said output signal is currently at when said high voltage rail and said low voltage rail changes state from said low voltage mode to a high voltage mode, said latch circuit comprising:

a first transistor having a gate, drain and source terminals wherein said gate terminal of said first transistor is coupled to said input terminal and said source terminal of said first transistor is coupled to said low voltage rail;

a second transistor having a gate, drain and source terminals wherein said gate terminal of said second transistor is coupled to said output of said inverter, said source terminal of said second transistor is coupled to said low voltage rail, and said drain terminal of said second transistor is coupled to said output driver circuit;

a third transistor having a gate, drain, source and bulk terminals wherein said gate terminal of said third transistor is coupled to said drain terminal of said second transistor, said source and bulk terminals of said third transistor are coupled to said high voltage rail, and said drain terminal of said third transistor is coupled to said drain terminal of said first transistor; and a fourth transistor having a gate, drain, source and bulk terminals wherein said gate terminal of said fourth transistor is coupled to said drain terminal of said first transistor, said source and bulk terminals of said fourth transistor are coupled to said high voltage rail, and said drain terminal of said fourth transistor is coupled to said drain terminal of said second transistor and to said output driver circuit;

an input circuit coupled to said latch circuit for sending said input signal and a complementary input signal to said latch circuit, said input circuit comprising:

an input terminal coupled to said latch circuit for receiving said input signal and for sending said input signal to said latch circuit; and an inverter having an input coupled to said input terminal and an output coupled to said latch circuit for generating said complementary input signal and for sending said complementary input signal to said latch circuit; and an output driver circuit coupled to said latch circuit for receiving said output signal from said latch circuit and for providing a full-swing output data latch signal wherein said full-swing output data latch signal ranges from said upper voltage level of said high voltage rail to ground.

18. A full-swing high voltage data latch in accordance with claim 17 wherein said first transistor and said second transistors are both n-channel transistors.

19. A full-swing high voltage data latch in accordance with claim 18 wherein said third transistor and said fourth transistors are both p-channel transistors.

20. A full-swing high voltage data latch in accordance with claim 17 wherein said latch circuit further comprises a holding circuit coupled to said low voltage rail and to said output driver circuit for holding said output signal of said latch circuit in a present state.

21. A full-swing high voltage data latch in accordance with claim 20 wherein said holding circuit comprises:

a fifth transistor having a gate, drain and source terminals wherein said gate terminal of said fifth transistor is coupled to said gate terminal of said third transistor, said drain terminal of said fifth transistor is coupled to said gate terminal of said fourth transistor and to said drain terminal of said third transistor, and said source terminal of said fifth transistor is coupled to said low voltage rail; and a sixth transistor having a gate, drain and source terminals wherein said gate terminal of said sixth transistor is coupled to said gate terminal of said fourth transistor, said drain terminal of said sixth transistor is coupled to said gate terminal of said third transistor and to said output driver circuit, and said source terminal of said sixth transistor is coupled to said low voltage rail.

22. A full-swing high voltage data latch in accordance with claim 21 wherein said fifth transistor and said sixth transistor are both n-channel transistors.

23. A full-swing high voltage data latch in accordance with claim 22 wherein said latch circuit further comprises a switching circuit coupled to said input circuit for allowing said output signal to switch faster with respect to said input signal and said complementary input signal when said high voltage rail and said low voltage rail operate in said low voltage mode.

24. A full-swing high voltage data latch in accordance with claim 23 wherein said switching circuit comprises:

a seventh transistor having a gate, drain and source terminals wherein said gate terminal of said seventh transistor is coupled to said input terminal, said drain terminal of said seventh transistor is coupled to said high voltage rail, and said source terminal of said seventh transistor is coupled to said gate terminal of said fifth transistor; and an eighth transistor having a gate, drain and source terminals wherein said gate terminal of said eighth transistor is coupled to said output of said inverter, said drain terminal of said eighth transistor is coupled to said high voltage rail, and said source terminal of said eighth transistor is coupled to said gate terminal of said sixth transistor.

25. A full-swing high voltage data latch in accordance with claim 24 wherein said seventh transistor and said eighth transistor are both n-channel transistors.

26. A full-swing high voltage data latch in accordance with claim 17 wherein said output driver circuit comprises:

an output terminal;

a ninth transistor having a gate, drain, source and bulk terminals wherein said gate terminal of said ninth transistor is coupled to said low voltage rail, said drain terminal of said ninth transistor is coupled to said output terminal, and said source and bulk terminals of said ninth transistor is coupled to said drain terminal of said fourth transistor; and a tenth transistor having a gate, drain and source terminals wherein said gate terminal of said tenth transistor is coupled to said output of said inverter, said drain terminal of said tenth transistor is coupled to said output terminal, and said source terminal of said tenth transistor is coupled to ground potential.

27. A full-swing high voltage data latch in accordance with claim 26 wherein said ninth transistor is a p-channel transistors.

28. A full-swing high voltage data latch in accordance with claim 26 wherein said tenth transistor is an n-channel transistors.

29. A full-swing high voltage data latch in accordance with claim 17 wherein said low voltage rail is at ground potential when said latch is operating under said low voltage mode.

30. A full-swing high voltage data latch in accordance with claim 17 wherein said low voltage rail is at a voltage greater than ground potential and less than a voltage of said high voltage rail when said latch is operating under said high voltage mode.

* * * * *